(12) United States Patent
Hosono et al.

(10) Patent No.: US 6,806,503 B2
(45) Date of Patent: Oct. 19, 2004

(54) LIGHT-EMITTING DIODE AND LASER DIODE HAVING N-TYPE ZNO LAYER AND P-TYPE SEMICONDUCTOR LASER

(75) Inventors: Hideo Hosono, Yamato (JP); Hiromichi Ota, Kawasaki (JP); Masahiro Orita, Funabashi (JP); Kenichi Kawamura, Sagamihara (JP); Nobuhiko Sarukura, Okazaki (JP); Msahiro Hirano, Tokyo (JP)

(73) Assignee: Japan Science and Technology Agency, Kawagchi (JP)

( * ) Notice: Subject to any disclaimer, the term of this patent is extended or adjusted under 35 U.S.C. 154(b) by 0 days.

(21) Appl. No.: 10/169,767

(22) PCT Filed: Jan. 24, 2001

(86) PCT No.: PCT/JP01/00465

§ 371 (c)(1),
(2), (4) Date: Nov. 5, 2002

(87) PCT Pub. No.: WO01/56088

PCT Pub. Date: Aug. 2, 2001

(65) Prior Publication Data

US 2003/0132449 A1 Jul. 17, 2003

(30) Foreign Application Priority Data

Jan. 28, 2000 (JP) ........................................ 2000-024843

(51) Int. Cl.⁷ .......................... H01L 27/15; H01L 31/12; H01L 33/00; H01L 21/00; H01L 21/26
(52) U.S. Cl. ........................... 257/79; 257/103; 438/69; 438/795; 438/799
(58) Field of Search ..................... 257/79, 103; 438/69, 438/795, 799

(56) References Cited

U.S. PATENT DOCUMENTS 5,192,987 A * 3/1993 Khan et al. ............... 257/183.1
5,228,044 A * 7/1993 Ohba ........................... 372/45

(List continued on next page.)

FOREIGN PATENT DOCUMENTS

EP      0 863 555 A2    9/1998
JP      2000-228516    8/2000

OTHER PUBLICATIONS

Applied Physics Letters., vol. 75, Issue 18, Nov. 1, 1999. See PCT search report.

(List continued on next page.)

*Primary Examiner*—Michael Trinh
*Assistant Examiner*—Ida M. Soward
(74) *Attorney, Agent, or Firm*—Westerman, Hattori, Daniels & Adrian, LLP (57) ABSTRACT

An ultraviolet-light-emitting semiconductor diode comprising an n-type ZnO layer with luminous characteristics formed on a transparent substrate, and a p-type semiconductor layer selected from the group consisting of $SrCu_2O_2$, $CuAlO_2$ and $CuGaO_2$, which is formed on the n-type ZnO layer to provide a p-n junction therebetween. The transparent substrate is preferably a single crystal substrate having atomically flat yttria-stabilized zirconia (YSZ) (III) surface. The n-type ZnO layer is formed on the transparent substrate having a temperature of 200 to 1200° C., and the p-type semiconductor layer selected from the group of $SrCu_2O_2$, $CuAlO_2$ and $CuGaO_2$ is formed on the n-type ZnO layer. The n-type ZnO layer may be formed without heating the substrate, and then the surface of the ZnO layer may be irradiated with ultraviolet light to promote crystallization therein.

8 Claims, 3 Drawing Sheets

U.S. PATENT DOCUMENTS

| | | | | |
|---|---|---|---|---|
| 5,661,074 A | * | 8/1997 | Tischler | 438/32 |
| 5,739,545 A | * | 4/1998 | Guha et al. | 257/40 |
| 5,834,331 A | * | 11/1998 | Razeghi | 438/40 |
| 6,045,626 A | * | 4/2000 | Yano et al. | 148/33.4 |
| 6,057,561 A | | 5/2000 | Kawasaki et al. | |
| 6,174,747 B1 | * | 1/2001 | Ho et al. | 438/31 |
| 6,190,777 B1 | * | 2/2001 | Asano et al. | 428/447 |
| 6,242,761 B1 | * | 6/2001 | Fujimoto et al. | 257/94 |
| 6,326,645 B1 | * | 12/2001 | Kadota | 257/94 |
| 6,366,017 B1 | * | 4/2002 | Antoniadis et al. | 313/506 |

OTHER PUBLICATIONS

Patent Abstract of Japan, Pub. No. 08–319138 of Dec. 3, 1996. See PCT search rpt.

Patent Abstract of Japan, Pub. No. 2000–022205 of Jan. 21, 2000. See PCT search report.

Patent Abstract of Japan, Pub. No. 11–260835 of Sept. 24, 1999. See PCT search rpt.

Patent Abstract of Japan, Pub. No. 2000–286410 of Oct. 13, 2000. See PCT search rpt.

Patent Abstract of Japan, Pub. No. 2000–281495 of Oct. 10, 2000. See PCT search rpt.

Patent Abstract of Japan, Pub. No. 11–297138 of Oct. 29, 1999. See PCT search rpt.

Patent Abstract of Japan, Pub. No. 10–012060 of Jan. 16, 1998. See PCT search rpt.

Patent Abstract of Japan, Pub. No. 2000–285752 of Oct. 13, 2000. See PCT search rpt.

Patent Abstract of Japan, Pub. No. 05–148066 of Jun. 15, 1993. See PCT search rpt.

Applied Physics Letter. vol. 73, Issue 2, Jul. 13, 1998. See PCT search rpt.

Letters to Nature, vol. 389, pp. 939–942, Oct. 1997. Discussed in the Spec.

* cited by examiner

LIGHT-EMITTING DIODE AND LASER DIODE HAVING N-TYPE ZNO LAYER AND P-TYPE SEMICONDUCTOR LASER

TECHNICAL FIELD

The present invention relates to a light-emitting diode and a laser diode capable of emitting ultraviolet light through current injection.

BACKGROUND ART

High-density recording media have been significantly developing in line with advances in information technologies. For example, read-write media in an optical recording system have been shifted from compact disks to digital video disks (DVDs) capable of recording in higher density. The reading and writing operations in such optical disks are performed through the medium of light. This implies the possibilities of higher recording density by use of light having a shorter wavelength.

From this point of view, as a semiconductor laser or laser diode (hereinafter referred to as "LD"), GaAlAs infrared-LDs for use in compact disks and GaInAlP infrared-LDs for use in DVDs have come into practical use. Further, various researches are carrying out toward the practical use of other LDs, such as a GaN light-emitting diode capable of emitting blue light having shorter wavelength.

Light-emitting diodes (hereinafter referred to as "LEDs") are predominantly used as displays, and practical applications of GaAs, GaP and GaN LEDs have open the way for three-color display. Researches of an ultraviolet LED are also carrying out forward applications to a backlight for liquid crystal displays or a light source for bactericidal devices or ultraviolet-cure resins.

Zinc oxide (hereinafter referred to as "ZnO") is known as one of luminescent materials emitting light having a shorter wavelength than that of GaN. ZnO is widely used as green-color fluorescent materials, for example, in low-energy-electron-impact type electroluminescence (EL) devices, and researches are also carrying out forward application to a transparent conductive film for solar cells by taking advantage of its high electrical conductivity and an optical transparency in a visible wavelength range.

It is known that ZnO is a direct transition type semiconductor having a band gap of about 3.38 eV at room temperature, and exhibits fluorescence in an ultraviolet wavelength range (about 350 nm at room temperature) by exciting with ultraviolet light. If light-emitting diodes or laser diodes can be fabricated using ZnO, such diodes would be able to use as a pumping source of fluorescent materials or high-density recording media.

DISCLOSURE OF INVENTION
(Problem to be Solved by the Invention)

Generally, it is required to join a p-type semiconductor to an n-type semiconductor to fabricate a light-emitting diode or laser diode. While an n-type ZnO thin-film can be fabricated without any difficulty, the technique of fabricating p-type ZnO thin-film involves many challenges. In fact, the first article concerning this technique was just reported in 1999 by Kawai, Osaka University, Japan. This article describes that a p-type ZnO thin-film can be achieved by preparing a target made of a sintered material containing Ga substituted for a part of Zn in ZnO and forming a film through a pulsed laser deposition (PLD) method under $N_2O$ gas so as to increase hole concentration of the film based on a co-doping effect.

However, any other research organizations have not been able to verify that the ZnO thin-film according to the above technique exhibits p-type semiconductor characteristics, at the time this application was filed. ZnO inherently tends to transform readily into an n-type semiconductor, and hardly fabricated as a stable p-type semiconductor. This complicates fabrication of LEDs to be actuated by current injection to its p-n junction.

It has not been reported any diode formed by joining an n-type ZnO semiconductor to a p-type ZnO semiconductor. $SrCu_2O_2$ is one of p-type semiconductors suitable for joining to the n-type ZnO semiconductor. $SrCu_2O_2$ is described as an indirect-transition type semiconductor having a band gap of about 3.2 eV at room temperature. To the contrary, calculations of its energy band suggest that it is a direct-transition type semiconductor. In addition, $SrCu_2O_2$ exhibits p-type conductivity by adding $K^+$ ions (Kudo, Yanagi, Hosono, Kawazoe, APL, 73, 220 (1998)).

The article of Kudo et al. describes as follows.

The carrier concentration and mobility of a $SrCu_2O_2$ thin-film fabricated through the PLD method are $1 \times 10^{-3}$ $cm^{-3}$ and 0.5 $cm^2/Vs$, respectively. It has a pyramidal quadratic system (space group: 141/a) and a lattice constant of a=b=0.5480 nm and c=0.9825 nm. While the lattice matching between a ZnO (0001) surface and a $SrCu_2O_2$ (112) surface is 19%, $SrCu_2O_2$ can be heteroepitaxially grown on ZnO because quintuple of the lattice constant of $SrCu_2O_2$ is approximately equal to sextuple of the lattice constant of ZnO. Further, they can be formed as a single crystal phase if a substrate has a temperature of 200° C. or more.

Kudo et al. confirmed that diode characteristics were yielded by forming a n-type ZnO film on a $SrCu_2O_2$ film (Kudo, Yanagi, Hosono, Kawazoe, Yano, APL, 75, 2851). However, a ZnO film having desirable crystallinity could not be obtained because in the fabrication process of Kudo et al., the $SrCu_2O_2$ film is formed on a substrate and then the ZnO film is formed on the $SrCu_2O_2$ film. Specifically, for assuring the desirable crystallinity in a ZnO film, the substrate must be heated up to 500° C. or more, which leads to vanished diode characteristics. As a result, Kudo et al. could not confirm any luminescence from the diode.

$CuAlO_2$ and $CuGaO_2$ are also p-type semiconductors suitable for joining to the n-type ZnO semiconductor. $CuAlO_2$ discovered and reported by H. Kawazoe et al. (Nature, vol.389, p.939 (1997)) is a semiconductor having a so-called delafossite-type crystal structure and exhibiting p-type conductivity. $CuAlO_2$ has a band gap of 3.1 eV or more, and may provide a thin film having a resistivity of 1Ω.

$CuGaO_2$ is also a semiconductor having a so-called delafossite-type crystal structure and exhibiting p-type conductivity. It is conceivable that these p-type transparent semiconductors have adaptability to fabrication of diodes, but there has not been any actual case of fabrication of diodes or light-emitting diodes from these materials.
(Means for Solving Problems)

The present invention provides a light-emitting diode comprising an n-type ZnO layer having desirable crystallinity and a p-type semiconductor layer selected from the group consisting of $SrCu_2O_2$, $CuAlO_2$ and $CuGaO_2$. The p-type layer is formed on the n-type ZnO layer to provide a p-n junction allowing the ZnO layer to emit ultraviolet light.

The present invention further provides a method for producing a light-emitting diode. This method comprises the steps of forming an n-type ZnO layer on a transparent substrate having a temperature which allows the ZnO layer to be formed with desirable crystallinity, and forming on the ZnO layer a p-type semiconductor layer selected from the group consisting of $SrCu_2O_2$, $CuAlO_2$ and $CuGaO_2$.

More specifically, according to a first aspect of the present invention, there is provided an ultraviolet-light-emitting diode comprising an n-type ZnO layer formed on a transparent substrate and exhibiting only intrinsic luminescence in the vicinity of a band gap thereof, and a p-type semiconductor layer selected from the group consisting of $SrCu_2O_2$, $CuAlO_2$ and $CuGaO_2$. The p-type layer is formed on the n-type ZnO layer to provide a p-n junction therebetween.

In the light-emitting diode according to the first aspect of the present invention, the transparent substrate may be a single crystal substrate. This single crystal substrate may have an atomically flat yttria-stabilized zirconia (YSZ) (111) surface.

The light-emitting diode according to the first aspect of the present invention may further include a transparent electrode inserted between the transparent substrate and the ZnO layer. The transparent electrode serves as an electrode for the ZnO layer.

The light-emitting diode may include a Ni layer formed on the p-type semiconductor layer. The Ni layer serves as an electrode for the p-type semiconductor layer.

The transparent substrate may include an indium-tin oxide (ITO) layer heteroepitaxially grown thereon to serve as a transparent negative electrode layer. In this case, the ZnO layer is heteroepitaxially grown on the ITO layer to serve as a luminescent layer, and the p-type semiconductor layer is formed on the ZnO layer to serve as a hole-injection layer. Further, the p-type semiconductor layer includes a Ni layer formed thereon to serve as a positive electrode.

In the light-emitting diode according to the first aspect of the present invention, the p-type semiconductor layer may be a $SrCu_2O_2$ layer containing a univalent metal element of 20 atom % substituted for the Sr site thereof.

According to a second aspect of the present invention, there is provided a method for producing the light-emitting diode according to the first aspect of the present invention. This method comprises the steps of forming the n-type ZnO layer on the transparent substrate while keeping the substrate at a temperature in the range of 200 to 1200° C., and forming on the ZnO layer the p-type semiconductor layer including $SrCu_2O_2$ while keeping the substrate at a temperature in the range of 200 to 800° C.

According to a third aspect of the present invention, there is provided a method for producing the light-emitting diode according to the first aspect of the present invention. This method comprises the steps of forming the n-type ZnO layer on the transparent substrate while keeping a substrate at a temperature in the range of 200 to 1200° C., and forming on the ZnO layer the p-type semiconductor layer including $CuAlO_2$ or $CuGaO_2$ while keeping the substrate at a temperature in the range of 500 to 800° C.

According to a fourth aspect of the present invention, there is provided a method for producing the light-emitting diode according to the first aspect of the present invention. This method comprises the steps of forming the n-type ZnO layer on the transparent substrate without heating the substrate, irradiating the surface of the ZnO layer with ultraviolet light to promote crystallization therein, and forming on the ZnO layer p-type semiconductor layer selected from the group consisting of $SrCu_2O_2$, $CuAlO_2$ and $CuGaO_2$ without heating the substrate, and irradiating the surface of the p-type semiconductor layer with ultraviolet light to promote crystallization therein.

Either one of the methods according to the second to fourth aspects of the present invention may further include the steps of optically polishing an yttria-stabilized zirconia (YSZ) single crystal, and heating said polished YSZ single crystal at a temperature in the range of 1000 to 1300° C. to prepare the transparent substrate having an atomically flat surface.

BEST MODE FOR CARRYING OUT THE INVENTION

A light-emitting diode of the present invention can be converted into a laser diode by forming a resonant structure therein. Specifically, each of the end faces of the light-emitting diode along its long axis is subjected to a reactive etching to provide a stripe-geometry structure thereon, and then total and partial reflection mirrors are fabricated in the end faces, respectively, to form a Fabry-Perot resonator. Each of the $SrCu_2O_2$ and ITO layers have a wider forbidden band and a smaller refractive index than those of the ZnO layer, and thereby acts as a current/optical confinement layer for confining longitudinal current and light within the ZnO layer. The stripe-geometry-structure in each of the end faces also acts as a current/optical confinement layer for confining lateral current and light within the ZnO layer. High-efficiency luminescence can be obtained by injecting current into this stripe-geometry-structure diode in the forward direction, and a laser oscillation can be obtained by a threshold or more of current injection.

The optical confinement effect is enhanced by increasing the difference between the respective refractive indexes of the $SrCu_2O_2$ and ITO layers, and the enhanced optical confinement effect can provide a lowered threshold of laser oscillation. For this purpose, $CuAlO_2$ or $CuGaO_2$ may be used as a substitute for $SrCu_2O_2$. Alternatively, a Mg-substituted ZnO layer may be inserted between the ZnO and ITO layers.

A desirable ohmic electrode is obtained by forming a p-type semiconductor layer having a relatively high carrier concentration on a p-type semiconductor layer having a relatively low carrier concentration to provide a p-n junction therebetween and forming an electrode on the former layer, and this ohmic electrode can provide a lowered current injection threshold.

In order to allow the ZnO layer in the diode to exhibit only desirable intrinsic luminescence in the vicinity of the band-gap thereof, the half bandwidth in the rocking curve of (0002) surface of ZnO crystal phase should be sufficiently narrow, or one degree or less, in the X-ray diffraction method. The half bandwidth is preferably 0.5 degree or less, more preferably 0.3 degree or less. The half bandwidth correlates with the crystallinity in the ZnO layer.

The light-emitting diode of the present invention is characterized by emitting an ultraviolet light of 380 nm, or emitting only ultraviolet light with deleting a green color. Specifically, for exhibiting only intrinsic luminescence in the vicinity of the band gap the crystallinity in the ZnO layer should be sufficiently enhanced to reduce oxygen defects and excessive Zn ion concentration in ZnO lattice.

Preferably, the transparent substrate sufficiently transmits therethrough the luminescence of 380 nm wavelength from the ZnO layer at room temperature. The transmissivity at 380 nm is preferably in the range of 50 to 100%, more preferably 80 to 100%.

While the transparent substrate may include a plastic substrate such as polycarbonate or poly methyl methacrylate, a glass substrate such as quartz glass or heat-resistant glass, or a crystalline substrate such as yttria-stabilized zirconia (YSZ) (111) surface or sapphire (0001)

surface, it is required to have chemical properties sustainable to the process for forming the ZnO layer, $SrCu_2O_2$ layer, $CuAlO_2$ layer or $CuGaO_2$ layer. Preferably, both surfaces of the glass or crystalline substrate are optically polished to provide increase transmissivity.

If the crystalline substrate is used as the transparent substrate, the structural regularity in the crystal faces of the substrate is reflected to the crystallinity in the ZnO layer. This advantageously provides enhanced crystallinity in the ZnO layer and improved luminescent characteristics. The crystalline substrate such as YSZ (111) surface or sapphire (0001) surface preferably achieves adequate lattice matching with ZnO crystal lattice.

When a transparent negative electrode layer is inserted between the transparent substrate and the ZnO layer as described later, the substrate is preferably made of a crystal capable of achieving adequate lattice matching with the material of the transparent negative electrode layer. For example, when the transparent negative electrode layer is made of indium-tin oxide (ITO), YSZ (111) surface is particularly suitable for the substrate, because the lattice of ITO is matched with YSZ so well.

The ZnO layer having desirable crystallinity is formed on the transparent substrate. The carrier concentration of the ZnO layer should be in the range of $1 \times 10^{17}$ to $1 \times 10^{20}/cm^3$. If the carrier concentration is less than $1 \times 10^{17}/cm^3$, the depletion layer in the p-n junction region will have an excessively increased thickness unsuited to luminescent. If the carrier concentration is greater than $1 \times 10^{20}/cm^3$, the depletion layer will have a too thin thickness unsuited to luminescent. Preferably, the carrier concentration of the ZnO layer is in the range of $1 \times 10^{18}$ to $1 \times 10^{19}/cm^3$ A process for forming the $SrCu_2O_2$ layer on the ZnO layer will be described in detail below. The carrier concentration of the $SrCu_2O_2$ layer is the range of $1 \times 10^{16}$ to $1 \times 10^{20}/cm^3$. If the carrier concentration is less than $1 \times 10^{16}/cm^3$, the ZnO layer will have reduced injectable electron holes unsuited to luminescent. The carrier concentration greater than $1 \times 10^{20}/cm^3$ leads to deteriorated luminous efficiency unsuited to luminescent.

In the light-emitting diode of the present invention, luminescent can be obtained by additionally forming negative and positive electrodes on the ZnO and $SrCu_2O_2$ layers, respectively. The negative electrode for applying voltage may be made of a material allowing an ohmic contact with the ZnO layer, and the positive electrode may be made of a material allowing an ohmic contact with the $SrCu_2O_2$ layer. Ag is typically used as the electrode material allowing an ohmic contact with the ZnO layer.

It is necessary to use a material having a small work function, such as Ni or Pt, as the material allowing an ohmic contact with the $SrCu_2O_2$ layer. If a material having a large work function such as Au or Ag, the ohmic contact cannot be achieved because of small work function of the $SrCu_2O_2$ layer.

Each contact surface between the layers may be formed by using these materials. For example, a Cu wire with Ag covering the surface thereof may be used as the positive electrode, and a Cu wire with Ni covering the surface thereof may be used as the negative electrode. Then, these wires may be attached to the layers with solder. In this case, a notch can be formed in the $SrCu_2O_2$ layer to expose outside a part of the surface of the ZnO layer so as to allow the positive electrode to be attached to the ZnO layer.

In the light-emitting diode of the present invention, a negative electrode layer may be formed between the transparent substrate and the ZnO layer, and a positive electrode layer may be formed on the $SrCu_2O_2$ layer. This structure can eliminate the need for adequately coating the lead wires to be connected to the light-emitting diode, and thereby the lead wires such as Cu wires without coating may be connected to the negative and positive electrode layers, respectively. The negative electrode layer is made of a transparent electrode material to allow luminescence from the ZnO layer to be extracted to outside through the negative electrode layer and the transparent substrate.

A suitable transparent electrode material for the negative electrode layer may include ITO, AZO (Al-doped ZnO), GZO (Ga-doped ZnO), $InGaO_3 (ZnO)_m$ (where m is a natural number), $SnO_2$, and $Ga_2O_3$. When a single crystal substrate is used as the transparent substrate, it is preferable to use a material capable of achieving adequate lattice matching between respective materials of the substrate and the ZnO layer. For example, when a YSZ (111) substrate is used as the transparent substrate, a suitable material for the negative electrode layer includes ITO, AZO, GZO, $InGaO_3 (ZnO)_m$, or $In_2O_3 (ZnO)_m$.

If a transparent electrode layer is applicable to the positive electrode layer, luminescence from the ZnO layer can be extracted to outside through the $SrCu_2O_2$ layer and the positive electrode layer. However, any suitable transparent electrode material for the positive electrode layer has not been discovered, and thereby the positive electrode is made of a metal such as Ni or Pt. An additional metal layer may be formed on the positive electrode material to provide enhanced connectivity with a lead wire or the like.

In the light-emitting diode of the present invention, a $CuAlO_2$ layer or $CuGaO_2$ layer may be used as a substitute for the $SrCu_2O_2$ layer. Luminescence can be obtained by applying a negative voltage to the ZnO layer and a positive voltage to the $CuAlO_2$ layer or the $CuGaO_2$ layer In this case, any suitable material allowing an ohmic contact with the $CuAlO_2$ layer or the $CuGaO_2$ layer, such as Ni or Pt having a small work function, may be used as the positive electrode material. Further, a positive electrode layer may be formed on the $CuAlO_2$ layer or the $CuGaO_2$ layer, and may be made of a metal such as Ni or Pt. An additional metal layer may be formed on the positive electrode material to provide enhanced connectivity with a lead wire or the like.

The term "Mg-substituted ZnO" herein means ZnO in which Zn site of ZnO crystal is substituted with Mg ions, and can be expressed by a chemical formula $(Zn_{1-x} Mg_x)O_2$ where 0<x<0.2. One of p-type semiconductor layers consisting of the $SrCu_2O_2$, $CuAlO_2$ and $CuGaO_2$ layers has a lower carrier concentration. For example, in the $SrCu_2O_2$ layer, the lower carrier concentration may be obtained by using $SrCu_2O_2$ as-is or reducing down the amount of K to be added as a dopant. The carrier concentration is arranged, for example, in the range of $1 \times 10^{16}/cm^3$ to $1 \times 10^{19}/cm^3$. One of p-type semiconductor layers consisting of the $SrCu_2O_2$, $CuAlO_2$ and $CuGaO_2$ layers has a higher carrier concentration, and is preferably made of the same material as that of the p-type semiconductor having the lower carrier concentration. For example, in the $SrCu_2O_2$ layer, the higher carrier concentration may be obtained by increasing the amount of K to be added as a dopant. This carrier concentration is required to be higher than that of the p-type semiconductor layer having the lower carrier concentration, and thereby arranged, for example, in the range of $1 \times 10^{17}/cm^3$ to $1 \times 10^{20}/cm^3$.

The light-emitting diode of the present invention is produced through a film forming method. The film forming method may include PLD, MBE, sputtering, vacuum evaporation and CVD methods. It is important to select a method capable of forming a ZnO film having desirable crystallinity without undesirable change in properties of the substrate. Various methods such as the PLD, sputtering, CVD or MBE method may be used to forming the $SrCu_2O_2$ layer on the ZnO layer. While the PLD method is suitable to form the ZnO and $SrCu_2O_2$ layers with desirable crystallinity, it has a problem in mass production due to a limited film area, for example, of about 20 mm diameter. Fortunately, a PLD apparatus capable of uniformly forming a film having about 6-inch diameter has been recently placed on the market.

The sputtering method is suitable for mass production because it can form a film having a large area. However, as compared to the PLD method, it cannot provide enhanced crystallinity in the ZnO and $SrCu_2O_2$ layers due to exposure of the films to plasmas. However, some apparatus such as a Helicon sputter apparatus or ion sputter apparatus capable of preventing exposure of the films to plasmas have been recently placed on the market.

The CVD method is suitable to form a large film with desirable homogeneity in the ZnO and $SrCu_2O_2$ layers. However, impurities such as C contained in gases of material tend to mixed into the layers. While the MBE method is suitable to form a film with enhanced crystallinity in the ZnO and $SrCu_2O_2$ layers as with the PLD method, it is required to introduce oxygen gas into a film-forming vessel, and thereby the surface of metal will be oxidized, resulting in difficulty in producing molecular beams.

While the vacuum evaporation method is one of simplest and easiest method, it has disadvantages of difficulty in forming a large size film and controlling the chemical composition of the $SrCu_2O_2$ layer. As above, each of the film forming methods has different features, and one suitable film forming method may be selected with focusing on its features meeting the purpose.

The applicable film forming method can be limited by the substrate material. In a plastic substrate used as the transparent substrate, if the substrate is heated up to a temperature, for example, of 100° C. or more, undesirable transformation is caused in the substrate. Thus, it is required to form a film at a temperature lower than that causing such an undesirable transformation. A process required for promoting an oxidative reaction of materials on the surface of the substrate, such as the CVD or MBE method, is unsuitable in this case.

The PLD or sputtering method allows the ZnO and $SrCu_2O_2$ layers to be formed on the plastic substrate. In this case, it is desired to promote crystallization through a suitable method such as light irradiation because such methods themselves cannot provide sufficiently enhanced crystallinity in the layers. For example, in the sputtering method, the ZnO layer is formed without heating the substrate or under a film forming condition at room temperature.

By virtue of low crystallization temperature of ZnO, the ZnO layer can be formed with desirable crystallinity at room temperature. However, in order to obtain enhanced luminous efficiency and produce a desirable light-emitting diode having increased brightness, the crystallinity of the ZnO layer is preferably enhanced as much as possible. For this purpose, it is desired to promote crystallization by irradiating the ZnO layer with ultraviolet light such as Kr F excimer laser.

Subsequently, the $SrCu_2O_2$ layer is formed on the ZnO layer through the sputtering method at room temperature, and then the formed $SrCu_2O_2$ layer is irradiated with ultraviolet light to promote crystallization therein. A transparent negative electrode to be sandwiched between the plastic layer and the ZnO layer can be formed in the same way. A metal positive electrode to be formed on the $SrCu_2O_2$ layer can be provided only through a film forming process at room temperature. Even if the metal layer is irradiated with ultraviolet light, the light is reflected by the metal surface and thereby any effect of transformation cannot be expected.

In either of the film forming methods, when a glass or single crystal substrate is used as the transparent substrate, during the formation of the ZnO layer, the substrate can be heated up to a temperature of 1000° C. Thus, the crystallinity in the ZnO layer can be sufficiently enhanced within the temperature. The temperature for forming the ZnO layer is preferably in the range of 200° C. to 1200° C. The crystallization is not sufficiently promoted at a temperature less than 200° C., while the components of the ZnO layer will be vaporized at a temperature greater than 1200° C.

When the transparent negative electrode is sandwiched between the transparent substrate and the ZnO layer, the ZnO layer should be formed at a selected temperature preventing the respective materials of the transparent negative electrode layer and the ZnO layer from reacting with each other at the boundary face therebetween. For example, when the transparent negative electrode layer is made of ITO, the temperature for forming the ZnO layer is limited to the range of 200° C. to 1000° C. At a temperature greater than 1000° C., ITO and ZnO are reacted with each other to form another phase, and thereby a desirable boundary face cannot be formed therebetween.

The temperature for forming the $SrCu_2O_2$ layer may be selectively arranged in the range of 200° C. to 800° C. The $SrCu_2O_2$ layer is not crystallized at a temperature less than 200° C., and will be reacted with the underlying ZnO layer at a temperature greater than 800° C., resulting in undesirable boundary face between the ZnO and $SrCu_2O_2$ layers.

The method for forming the $SrCu_2O_2$ layer may be applied to form the $CuAlO_2$ layer or $CuGaO_2$ layer as a substitute for the $SrCu_2O_2$ layer. The temperature for forming the $CuAlO_2$ layer or $CuGaO_2$ layer may be selectively arranged in the range of 500° C. to 800° C. The $CuAlO_2$ layer or $CuGaO_2$ layer is not crystallized at a temperature less than 500° C., and will be reacted with the underlying ZnO layer at a temperature greater than 800° C., resulting in undesirable boundary face between the ZnO and $CuAlO_2$ layers or the ZnO and $CuGaO_2$ layers.

Particularly, by producing the light-emitting diode of the present invention, for example, on a YSZ (111) single crystal substrate through the PLD method used as a film forming method, the ZnO layer can be formed with enhanced crystallinity and desirable boundary face between the ZnO and $SrCu_2O_2$ layers to achieve excellent luminous efficiency in the obtained light-emitting diode.

Laser such as Kr F or Ar F excimer laser having a light energy greater than the band gap of the ZnO and $SrCu_2O_2$ layers is used as a light source for irradiating the target. Laser having a light energy less than the band gap is not absorbed by the ZnO or $SrCu_2O_2$ target and thereby any laser ablation cannot be caused.

The laser having the light energy greater than the band gap is absorbed by the ZnO or $SrCu_2O_2$ target to cause laser ablation so that the target material is deposited on the substrate placed oppositely to the target to form a film. Since vacuum ultraviolet light will be inherently absorbed by oxygen in air, it is required to form vacuum along the optical path. This leads to complicated structure, difficult management and increased cost in the apparatus. In contrast, the Kr F excimer laser can advantageously provide sufficiently strong light because it is not absorbed by oxygen in air, and related apparatuses are widely place on the market.

For example, when a YSZ (111) substrate is used as the transparent substrate, the ZnO layer can be formed with desirable crystallinity, and ITO can be used as the transparent negative electrode. This allows a light-emitting diode to be produced with excellent luminous efficient. Because, The YSZ (111) surface can achieve sufficient lattice matching with the ITO (111) surface, and the ITO (111) can achieve sufficient lattice matching with the ZnO (0001) surface. Preferably, the YSZ (111) surface is sufficiently flattened to utilize the above feature in lattice matching.

It is known that the surface of $Al_2O_3$ single crystal substrate, $SrTiO_3$ single crystal substrate or the like can be flattened by processing at high temperature under vacuum or ambient pressure to the extent that step and terrace structure can be observed. Such structure is generally referred to as "atomically flat surface"

The inventors has discovered that a similar atomically flat surface could be formed by subjecting YSZ single crystal having both faces optically polished to a heat treatment at a temperature in the range of 1000° C. to 1300° C., and the heat-treated YSZ single crystal was suited to use as a substrate for the light-emitting diode of the present invention. The substrate having the atomically flat surface is disposed oppositely to each target with a distance, for example, in the range of 30 to 70 mm, therebetween. Preferably, each of the target and substrate is rotated in its axis by a rotating mechanism.

It is desired to provide an ultimate vacuum of $1 \times 10^{-5}$ Pa in the vacuum vessel to remove water vapor from the vessel. The process for removing water vapor is a critical point in the entire processes because the $SrCu_2O_2$ readily causes chemical reaction with water. After water vapor is removed by sufficiently increasing the vacuum in the vessel, dry oxygen is introduced into the vessel.

In the process for forming the ITO negative electrode layer, the oxygen gas having a pressure in the range of $1 \times 10^{-4}$ Pa to 100 Pa is introduced into the vessel. At a pressure less than $1 \times 10^{-4}$ Pa, metal In undesirably separates out on the substrate. At a pressure greater than 100 Pa, plume to be formed by irradiating the target with laser become small, and thereby a film cannot be effectively formed.

The substrate can have a temperature in the range of 300° C. to 1200° C. At a temperature less than 300° C., the crystallization of ITC is not sufficiently promoted and thereby desirable luminous characteristics cannot be expected. At a temperature greater than 1200° C., components of ITO will be vaporized, resulting in ineffective formation of a film. Preferably, the temperature of the substrate is in the range of 500° C. to 900° C. Within this temperature range, an ITO film heteroepitaxially grown on YSZ (111) surface can be formed.

For example, an ITO sintered body containing 10 wt % of $SnO_2$ is used as the target. Preferably, the target is sufficiently densified. The ITO layer preferably has a thickness in the range of 50 nm to 2000 nm. If the ITO has a thickness less than 50 nm, this thin thickness causes high resistance, and thereby the negative electrode cannot adequately function. If the ITO has a thickness greater than 2000 nm, this thick thickness causes lowered optical transmissivity, resulting in reduced amount of light to be extracted outside.

It is required to select adequate energy density of laser because the energy density has an impact on the crystallinity, grain structure, surface flatness and transparent conductivity in the ITO layer. The energy density of laser is a value depending on the apparatus. In the PLD apparatus described in an example described later, a desired film could be obtained by selecting the energy density in the range of 1 to 10 $J/cm^2$.

In the process for forming the ZnO layer, the oxygen gas having a pressure in the range of $1 \times 10^{-4}$ Pa to 100 Pa is introduced into the vessel. At a pressure less than $1 \times 10^{-4}$ Pa, metal Zn undesirably separates out on the substrate. At a pressure greater than 100 Pa, plume to be formed by irradiating the target with laser become small, and thereby a film cannot be effectively formed.

The substrate can have a temperature in the range of 300° C. to 1000° C. At a temperature less than 300° C., the crystallization of ZnO is not sufficiently promoted and thereby desirable luminous characteristics cannot be expected. At a temperature greater than 1000° C., the ITO layer will be reacted with the ZnO layer and thereby a desirable boundary face cannot be formed between the ITO and ZnO layers. Preferably, the temperature of the substrate is in the range of 500° C. to 800° C. Within this temperature range, the ZnO (0001) surface can be heteroepitaxially grown on the ITO (111) surface.

A ZnO sintered body is used as the target. Preferably, the target is sufficiently densified. The ZnO layer preferably has a thickness in the range of 20 nm to 2000 nm. If the ZnO layer has a thickness less than 20 nm, this thin thickness cannot cause effective luminescence. If the ZnO layer has a thickness greater than 2000 nm, this thick thickness causes lowered optical transmissivity, resulting in reduced intensity of light to be extracted outside.

It is required to select adequate energy density of laser because the energy density has an impact on the crystallinity, grain structure, surface flatness and transparent conductivity in the ZnO layer. The energy density of laser is a value depending on the apparatus. In the PLD apparatus described in the example, a desired film could be obtained by selecting the energy density in the range of 1 to 10 $J/cm^2$.

The surface of the ZnO layer should be sufficiently flattened in the step for forming the $SrCu_2O_2$ layer to provide a desirable boundary face between the ZnO and $SrCu_2O_2$ layers. It is generally known that the PLD method tends to form semispherical protrusions, so-called droplets, on the surface of a thin film. These protrusions undesirably form a p-n junction on the boundary face between the ZnO and $SrCu_2O_2$ layers. This is significantly disadvantageous to effectively inject conductive holes from the $SrCu_2O_2$ layer into the ZnO layer and achieve recombination of the conductive holes and electrons.

From this point of view, the surface of the ZnO layer is preferably flattened by subjecting to annealing at 800° C. to 1200° C. in a vacuum vessel, or irradiating the surface of the ZnO layer with a gas cluster beam, or taking it out of the vacuum vessel and polishing with a polishing agent. The insufficient flatness of the surface causes degraded luminous efficiency or can provide a non-luminiferous diode, resulting in significantly deteriorated yield ratio.

In the process for forming the $SrCu_2O_2$ layer, the oxygen gas having a pressure in the range of $1 \times 10^{-4}$ Pa to 100 Pa is introduced into the vessel. At a pressure less than $1 \times 10^{-4}$ Pa, metal Sr or Cu undesirably separates out on the substrate. At a pressure greater than 100 Pa, plume to be formed by irradiating the target with laser become small, and thereby a film cannot be effectively formed.

The substrate can have a temperature in the range of 250° C. to 800° C. At a temperature less than 250° C., the crystallization of $SrCu_2O_2$ is not sufficiently promoted and thereby desirable luminous characteristics cannot be expected. At a temperature greater than 800° C., the $SrCu_2O_2$ layer will be reacted with the ZnO layer and thereby a desirable boundary face cannot be formed between the ZnO and $SrCu_2O_2$ layers. Preferably, the temperature of the substrate is in the range of 300° C. to 550° C. Within this temperature range, the $SrCu_2O_2$ layer can be formed on the ZnO (0001) surface. In particular, by selecting the temperature around 500° C., the $SrCu_2O_2$ layer can be heteroepitaxially grown on the ZnO (0001) surface.

A $SrCu_2O_2$ sintered body is used as the target. A univalent metal of 20 atom % or less as a dopant may be substituted for the Sr site thereof. For example, the hole concentration of the film can be increased by adding 0.3 to 5 mol % of K therein. The target is sintered under inert gas such as $N_2$ or Ar.

Preferably, the target is sufficiently densified. The densification is relatively difficult to achieve through an ordinary method, but a hot pressing method or a hot isostatic pressing method is suitable for this densification. The $SrCu_2O_2$ layer preferably has a thickness in the range of 20 nm to 2000 nm. If the $SrCu_2O_2$ layer has a thickness less than 20 nm, this thin thickness cannot cause effective injection of holes to the ZnO layer. If the ZnO layer has a thickness greater than 2000 nm, this thick thickness is unproductive.

It is required to select adequate energy density of laser because the energy density has an impact on the crystallinity, grain structure, surface flatness and transparent conductivity in the $SrCu_2O_2$ layer. The energy density of laser is a value depending on the apparatus. In the PLD apparatus described in the example, a desired film could be obtained by selecting the energy density in the range of 1 to 10 $J/cm^2$.

In the process for forming the $CuAlO_2$ layer or $CuGaO_2$ layer, the oxygen gas having a pressure in the range of $1\times10^{-4}$ Pa to 100 Pa is introduced into the vessel. At a pressure less than $1\times10^{-4}$ Pa, metal Cu, Al or Ga undesirably separates out on the substrate. At a pressure greater than 100 Pa, plume to be formed by irradiating the target with laser become small, and thereby a film cannot be effectively formed.

The substrate can have a temperature in the range of 500° C. to 800° C. At a temperature less than 500° C., the crystallization of the $CuAlO_2$ or $CuGaO_2$ is not sufficiently promoted and thereby desirable luminous characteristics cannot be expected. At a temperature greater than 800° C., the $CuAlO_2$ or $CuGaO_2$ layer will be reacted with the ZnO layer and thereby a desirable boundary face cannot be formed between the ZnO layer and the $CuAlO_2$ or $CuGaO_2$ layer. Preferably, the temperature of the substrate is in the range of 650° C. to 750° C. Within this temperature range, the $CuAlO_2$ or $CuGaO_2$ layer can be formed on the ZnO (0001) surface. In particular, by selecting the temperature around 700° C., the $CuAlO_2$ layer or $CuGaO_2$ layer can be heteroepitaxially grown on the ZnO (0001) surface.

A $CuAlO_2$ or $CuGaO_2$ sintered body is used as the target. The hole concentration of the film can be increased by adding a univalent metal as a dopant, for example, 0.3 to 5 mol % of K therein. The target is sintered under inert gas such as $N_2$ or Ar. Preferably, the target is sufficiently densified. The densification is relatively difficult to achieve through an ordinary method, but a hot pressing method or a hot isostatic pressing method is suitable for this densification. The $CuAlO_2$ or $CuGaO_2$ layer preferably has a thickness in the range of 20 nm to 2000 nm. If the $CuAlO_2$ or $CuGaO_2$ layer has a thickness less than 20 nm, this thin thickness cannot cause effective injection of holes to the ZnO layer. If the ZnO layer has a thickness greater than 2000 nm, this thick thickness is unproductive.

It is required to select adequate energy density of laser because the energy density has an impact on the crystallinity, grain structure, surface flatness and transparent conductivity in the $CuAlO_2$ or $CuGaO_2$ layer. The energy density of laser is a value depending on the apparatus. In the PLD apparatus described in the example, a desired film could be obtained by selecting the energy density in the range of 1 to 10 $J/cm^2$.

A Ni layer is particularly suitable for the positive electrode. The Ni layer can be formed through any film forming method. When the Ni layer is formed through the PLD method by use of a Ni target, any additional equipment is not require for forming the Ni film. However, the film forming efficiency of this method is relatively low because the Ni target reflects laser. In view of the film forming efficiency, a suitable method is the sputtering or vacuum evaporation method. Further, a suitable metal layer may be formed on the Ni layer to provide enhanced connectivity with a connecting wire such as a Cu wire.

Ni has a significantly low etching speed. If an electrode material suitable for being etched and capable of achieving an ohmic contact with the $SrCu_2O_2$ layer is available, it is desired to use this material as the positive electrode. The same can be applied to the case where the $CuAlO_2$ layer or $CuGaO_2$ layer is used as a substitute for the $SrCu_2O_2$ layer.

EXAMPLE

Figure 1:
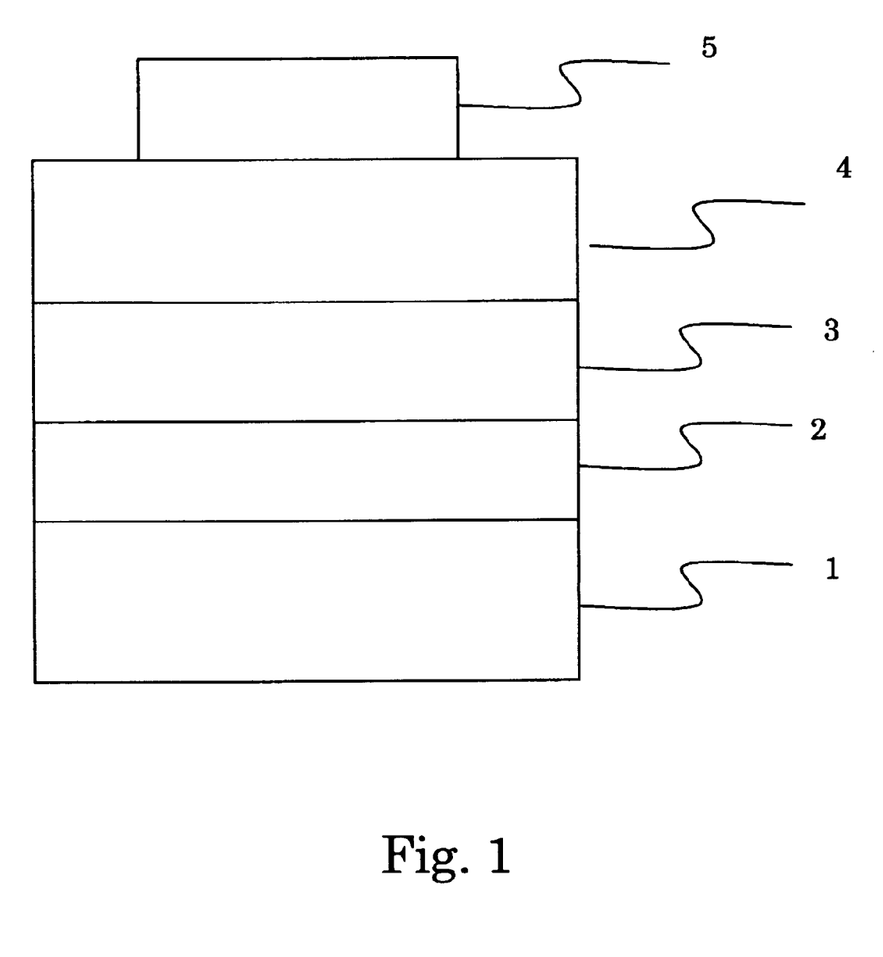
FIG. 1 shows an ultraviolet light emitting diode of the present invention, showing YSZ (111) substrate 1; ITO layer 2; n-type ZnO layer 3; p-type layer 4; and Ni layer 5.
Figure 2:
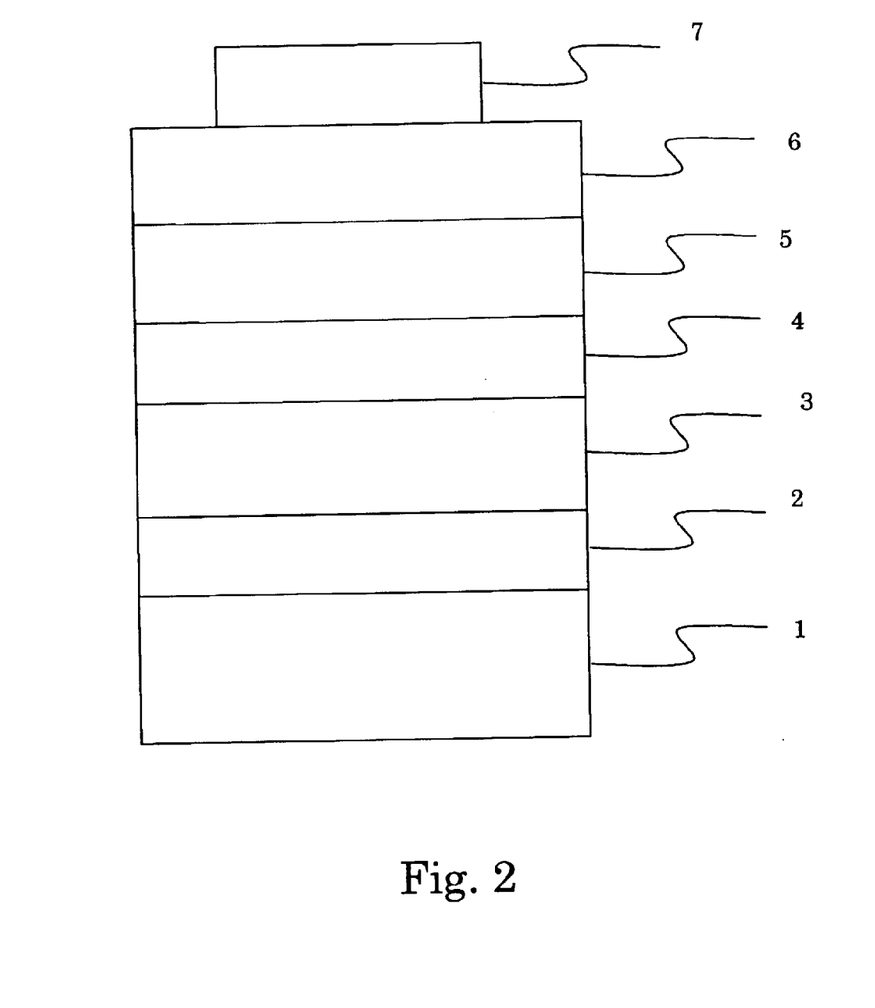
FIG. 2 shows an ultraviolet light emitting diode of the present invention, showing YSZ (111) substrate 1; ITO layer 2; n-type (ZnMg)O layer 3; n-type ZnO layer 4; p-type hole injection layer 5; p-type semiconduction layer 6: and Ni layer 7.
Figure 3:
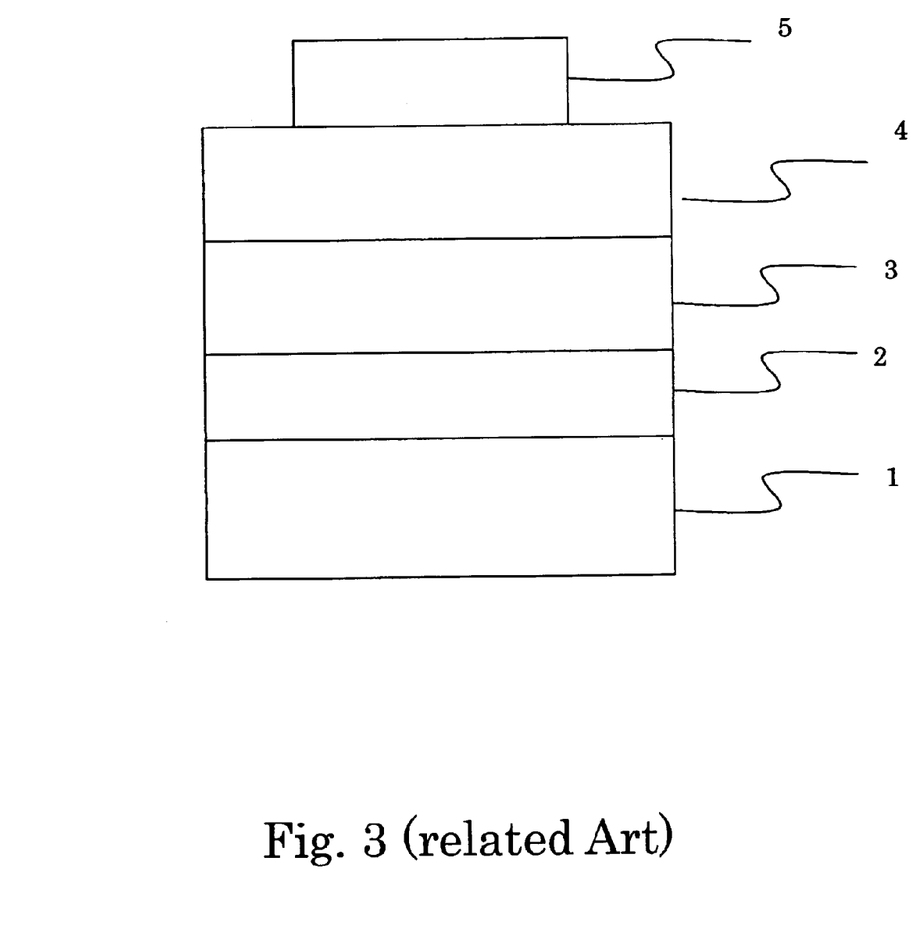
FIG. 3 shows a conventional light emitting diode, showing YSZ (111) substrate 1: Ni layer (electrode) 2; p-type layer 3; n-type ZnO layer 4; and electrode 5.

The present invention will be described in detail in conjunction with the following example.

Example 1

Fabrication of Laminated Films

Targets of an $In_2O_3$ (herein after referred to as "ITO") sintered body containing 10 wt % of $SnO_2$, a ZnO sintered body, a $Sr_{1-x}K_xCu_2O_2$ sintered body (where x is a substitution rate of K ion substituted at Sr site, and x □ 0.2) and metal Ni were prepared. These targets were placed in a PLD chamber, and the vacuum of $1\times10^{-6}$ Pa was provided in the chamber.

Then, a polished substrate having YSZ (111) surface having a surface roughness of 1 nm or less was disposed opposedly to and above the target with a distance of 30 mm therebetween. Oxygen gas having a pressure of $2\times10^{-3}$ Pa as atmospheric gas was introduced in the chamber. After the substrate was heated up to 900° C., the surface of the ITO target was irradiated with Kr F (248 nm) excimer laser pulses through a silica glass window while arranging the energy density of laser in 6 $J/cm^2$ for each pulse.

The laser was stopped when the ITO thin-film had a thickness of 800 nm, and the temperature of the substrate was set at 800° C. Then, a ZnO thin-film was formed while arranging the energy density of laser in 5 J/cm$^2$ for each pulse. The laser was interrupted when the ZnO thin-film had a thickness of 400 nm, and the temperature of the substrate was set at 350° C.

Then, a SrCu$_2$O$_2$ thin-film was formed while arranging the energy density of laser in 2 J/cm$^2$ for each pulse. The laser was interrupted when the SrCu$_2$O$_2$ thin-film had a thickness of 200 nm, and the temperature of the substrate was set at 25° C. Then, the Ni thin-film was formed by irradiating the Ni target with laser. The laser was interrupted when the Ni thin-film had a thickness of 20 nm, and the laminated film was taken out to ambient air. In order to use a W probe coated with Ag as a lead wire for injecting current, the surface of the Ni layer in the laminated film was coated with Au through the sputtering method. The thickness of the Au thin-film was 100 nm.

Fabrication of Mesa Structure

The surface of the laminated film was coated with a commercially available photoresist (AZ p4620) to provide its thickness of 5 μm by spin coating (2000 rpm, 20 s), and then dried at 90° C. for 30 minutes. Then, the surface of the film was irradiated with ultraviolet light (20 mW, 10 s) through a circular photomask having a diameter of 500 μm, and immersed in a commercially available developer (AZ developer) to form a pattern. In this state, adhesiveness of the pattern and etching resistance of the film were insufficient. Thus, the film was subjected to a heat treatment at 110° C. for 30 minutes and subsequently at 200° C. for 1 h, under ambient air.

Reactive Ion Etching

A mesa structure was fabricated using CF$_4$ gas and Ar gas through a reactive ion etching method. The Au and Ni layers were etched using CF$_4$ gas under a gas pressure of 5 Pa, at an RF power of 250 W. Then, the SrCu$_2$O$_2$, ZnO and ITO layers were etched using Ar gas under a gas pressure of 4.5 Pa, at an RF power of 250 W. The ITO layer was etched to the depth of 200 nm.

Electrical and Luminous Characteristics

The W probe was brought into contact with the ITO and Au regions of the above mesa structure device, and the negative and positive poles were connected to the ITO and Au region, respectively. When current was applied thereto, the current value rapidly increased at an applied voltage of 0.3 V or more. This is one of characteristics of p-n junction diodes. Luminescent rapidly increased at 0.3 V or more. The wavelength of the light was about 380 nm.

Comparative Example

Fabrication of Laminated Films

The film forming process of the example was reversed. That is, a SrCu$_2$O$_2$ thin-film was first formed on a substrate, and then a ZnO thin-film was formed on the SrCu$_2$O$_2$ thin-film. In this case, a p-type transparent electrode material exhibiting high conductivity was not available, and thereby a glass substrate coated with Ni as the electrode was used.

Targets of an In$_2$O$_3$ sintered body containing 10 wt % of SnO$_2$, a ZnO sintered body, a Sr$_{1-x}$K$_x$Cu$_2$O$_2$ sintered body and metal Ni were prepared. These targets were placed in a PLD chamber, and the vacuum of 1×10$^{-6}$ Pa was provided in the chamber. Then, a SiO$_2$ glass substrate having Ni deposited thereon was disposed oppesedly to and above the target with a distance of 30 mm therebetween. Oxygen gas having a pressure of 2×10$^{-3}$ Pa as atmospheric gas was introduced in the chamber. After the substrate was heated up to 350° C., the surface of the SrCu$_2$O$_2$ target was irradiated with Kr F (248 nm) excimer laser pulses through a silica glass window while arranging the energy density of laser in 2 J/cm$^2$ for each pulse.

The laser was stopped when the SrCu$_2$O$_2$ thin-film had a thickness of 200 nm. Then, a ZnO thin-film was formed while arranging the energy density of laser in 5 J/cm$^2$ for each pulse. The laser was interrupted when the ZnO thin-film had a thickness of 400 nm. Then, an ITO thin-film was formed while arranging the energy density of laser in 6 J/cm$^2$ for each pulse. The laser was interrupted when the ITO thin-film had a thickness of 800 nm, and the laminated film was taken out to ambient air. A mesa structure was provided to the formed laminated film. In the measurement of a current-voltage characteristic, a non-linear characteristic indicating p-n junction could be observed. However, no luminescent could be confirmed.

Industrial Applicability

The light-emitting diode of the present invention including a p-n junction yielded by forming SrCu$_2$O$_2$, CuAlO$_2$ or CuGaO$_2$ layer on a ZnO having a desired crystallinity provides ultraviolet light having a wavelength of 380 nm at room temperature without any difficulty.

The light-emitting diode of the present invention can be significantly downsized through micro fabrication, and thereby is best suited to optical recording media. In addtion, the light-emitting diode has a shorter wavelength than that of conventional diode. This provides higher recording density in optical recording media.

Further, the light-emitting diode of the present invention emits ultraviolet light. Thus, this light-emitting diode is suited to a pumping source of any visible fluorescent materials. This makes it possible to achieve a ultra-small or super-sized and ultra-slim light source to be applicable to illumination devices and display devices.

Further, the light-emitting diode of the present invention emitting ultraviolet light is suited to a pumping source of a hydrogen-generating photocatalyst which are recently developing, for example, to be applicable to hydrogen-source system for automobile hydrogen-fueled engine. The light-emitting diode of the present invention can provide resource saving and environmentally friendly devices, and contribute to perennial development of society.

What is claimed is:

1. An ultraviolet-light-emitting diode comprising:
    an n-type ZnO layer formed on a transparent substrate and exhibiting only intrinsic luminescence in the vicinity of a band gap thereof, and
    a p-type semiconductor layer selected from the group consisting of SrCu$_2$O$_2$, CUAlO$_2$ and CuGaO$_2$, said p-type layer being formed on said n-type ZnO layer to provide a p-n junction therebetween,
    wherein said transparent substrate is yttria-stabilized zirconia (YSZ) (111) single crystal substrate having an atomically flat surface,
    wherein said light-emitting diode further includes an indium-tin oxide (ITO) layer heteroepitaxially grown on said transparent substrate to serve as a transparent negative electrode layer, and
    wherein the ZnO layer is heteroepitaxially grown on the ITO layer to serve as a luminescent layer, the p-type semiconductor layer being formed on said ZnO layer to serve as a hole-injection layer.

2. A light-emitting diode as defined in claim 1, wherein said p-type semiconductor layer is a SrCu$_2$O$_2$ layer, wherein the p-type semiconductor layer contains 20 atom % or less of a univalent metal substituted for a Sr site of the $SrCu_2O_2$ layer.

3. A method for producing a light-emitting diode which includes an n-type ZnO layer formed on a transparent substrate and exhibiting only intrinsic luminescence in the vicinity of a band gap thereof, and a p-type semiconductor layer including $SrCu_2O_2$, said p-type layer being formed on said n-type ZnO layer to provide a p-n junction therebetween, said method comprising the steps of forming the n-type ZnO layer on the transparent yttria-stabilized zirconia (YSZ) (111) single crystal substrate having an atomically flat surface while keeping the substrate at a temperature in the range of 200 to 1200° C., and forming on the ZnO layer the p-type semiconductor layer including $SrCu_2O_2$ while keeping the substrate at a temperature in the range of 200 to 800° C.

4. A method for producing a light-emitting diode which includes an n-type ZnO layer formed on a transparent substrate and exhibiting only intrinsic luminescence in the vicinity of a band gap thereof, and a p-type semiconductor layer including one of $CuAlO_2$ and $CuGaO_2$, said p-type layer being formed on said n-type ZnO layer to provide a p-n junction therebetween, said method comprising the steps of forming the n-type ZnO layer on the transparent yttria-stabilized zirconia (YSZ) (111) single crystal substrate having an atomically flat surface while keeping a substrate at a temperature in the range of 200 to 1200° C., and forming on the ZnO layer the p-type semiconductor layer including $CuAlO_2$ or $CuGaO_2$ while keeping the substrate at a temperature in the range of 500 to 800° C.

5. A method for producing a light-emitting diode which including an n-type ZnO layer formed on a transparent substrate and exhibiting only intrinsic luminescence in the vicinity of a band gap thereof, and a p-type semiconductor layer selected from the group consisting of $SrCu_2O_2$, $CuAlO_2$ and $CuGaO_2$, said p-type layer being formed on said n-type ZnO layer to provide a p-n junction therebetween, said method comprising the steps of forming the n-type ZnO layer on the transparent yttria-stabilized zirconia (YSZ) (111) single crystal substrate having an atomically flat surface without heating the substrate, irradiating the surface of the ZnO layer with ultraviolet light to promote crystallization therein, and forming on the ZnO layer the p-type semiconductor layer selected from the group consisting of $SrCu_2O_2$, $CuAlO_2$ and $CuGaO_2$ without heating the substrate, and irradiating the surface of the p-type semiconductor layer with ultraviolet light to promote crystallization therein.

6. A method as defined in either one on claims 3 to 5, which further includes the steps of optically polishing an yttria-stabilized zirconia (YSZ) single crystal, and heating said polished YSZ single crystal at a temperature in the range of 1000 to 1300° C. to prepare the transparent substrate having an atomically flat surface.

7. An ultraviolet-light-emitting laser diode comprising:
   an n-type ZnO layer formed on a transparent yttria-stabilized zirconia (YSZ) (111) single crystal substrate having an atomically flat surface and exhibiting only intrinsic luminescence in the vicinity of a band gap thereof; and
   a p-type semiconductor layer selected from the group consisting of $SrCu_2O_2$, $CuAlO_2$ and $CuGaO_2$, said p-type layer being formed on said n-type ZnO layer to provide a p-n junction therebetween,
   wherein a Mg-substituted ZnO is heteroepitaxially grown on said single crystal substrate,
   wherein said n-type ZnO layer is heteroepitaxially grown on said Mg-substituted ZnO, and
   wherein said p-type semiconductor layer includes; a first p-type semiconductor layer having a relatively lower carrier concentration and serving as a hole-injection layer, and a second p-type semiconductor layer having a relatively high carrier concentration, said second p-type semiconductor layer being formed on said first p-type semiconductor layer.

8. An ultraviolet-light-emitting diode as defined in claim 1, which further includes a Ni layer formed on the p-type semiconductor layer to serve as a positive electrode.

* * * * *